(12) United States Patent
Yamazaki et al.

(10) Patent No.: US 11,059,133 B2
(45) Date of Patent: Jul. 13, 2021

(54) BONDED STRUCTURE, METHOD OF MANUFACTURING SAME, ELECTRIC MOTOR, AND METHOD OF MANUFACTURING SAME

(71) Applicant: MITSUBISHI ELECTRIC CORPORATION, Chiyoda-ku (JP)

(72) Inventors: Koji Yamazaki, Chiyoda-ku (JP); Tomoaki Kato, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 122 days.

(21) Appl. No.: 16/492,806

(22) PCT Filed: Jan. 26, 2018

(86) PCT No.: PCT/JP2018/002517
§ 371 (c)(1),
(2) Date: Sep. 10, 2019

(87) PCT Pub. No.: WO2018/198455
PCT Pub. Date: Nov. 1, 2018

(65) Prior Publication Data
US 2020/0262010 A1 Aug. 20, 2020

(30) Foreign Application Priority Data
Apr. 28, 2017 (JP) .............................. JP2017-089912

(51) Int. Cl.
*B23K 35/28* (2006.01)
*B23K 1/19* (2006.01)
(Continued)

(52) U.S. Cl.
CPC .............. *B23K 35/282* (2013.01); *B23K 1/19* (2013.01); *B32B 15/017* (2013.01); *C22C 18/04* (2013.01);
(Continued)

(58) Field of Classification Search
None
See application file for complete search history.

(56) References Cited

U.S. PATENT DOCUMENTS

| 4,451,541 A | 5/1984 | Beal |
| 2012/0319280 A1 | 12/2012 | Suganuma et al. |
| 2015/0151387 A1 | 6/2015 | Li et al. |

FOREIGN PATENT DOCUMENTS

| JP | 55-128396 A | 10/1980 |
| JP | 2013-30607 A | 2/2013 |

(Continued)

OTHER PUBLICATIONS

International Search Report dated May 1, 2018 in PCT/JP2018/002517 filed Jan. 26, 2018.

*Primary Examiner* — Daniel J. Schleis
(74) *Attorney, Agent, or Firm* — Xsensus LLP

(57) ABSTRACT

A bonded structure, including a Zn-based brazing filler metal and a Cu-based bonding object bonded to each other, wherein the bonded structure includes a joint including a first alloy phase, a second alloy phase and a third alloy phase between the Zn-based brazing filler metal and the Cu-based bonding object, wherein the second alloy phase is formed at an interface between the first alloy phase and the third alloy phase, and wherein, in a cross section parallel to a bonding direction, a ratio of the second alloy phase at the interface between the first alloy phase and the third alloy phase is less than 80%.

4 Claims, 7 Drawing Sheets

(51) Int. Cl.
*B32B 15/01* (2006.01)
*C22C 18/04* (2006.01)
*B23K 103/10* (2006.01)
*B23K 103/12* (2006.01)

(52) U.S. Cl.
CPC ...... *B23K 2103/10* (2018.08); *B23K 2103/12* (2018.08)

(56) References Cited

FOREIGN PATENT DOCUMENTS

| | | | |
|---|---|---|---|
| JP | 2013-78795 | A | 5/2013 |
| JP | 2013-176780 | A | 9/2013 |
| JP | 2017-501879 | A | 1/2017 |
| WO | WO 2011/108436 | A1 | 9/2011 |
| WO | WO 2015/084723 | A1 | 6/2015 |
| WO | WO 2015/170572 | A1 | 11/2015 |

BONDED STRUCTURE, METHOD OF MANUFACTURING SAME, ELECTRIC MOTOR, AND METHOD OF MANUFACTURING SAME

TECHNICAL FIELD

The present invention relates to a bonded structure using a Cu-based bonding object and a Zn-based brazing filler metal and a method of manufacturing the same, and an electric motor and a method of manufacturing the same.

BACKGROUND ART

In general, copper (Cu) and aluminum (Al) are excellent in conductivity and relatively inexpensive in material cost, and hence are used as a winding wire of an electric motor (motor) or the like by being insulation-coated mainly with enamel to be formed into a copper winding wire and an aluminum winding wire, respectively. The winding wire is electrically connected to a terminal or a lead wire connected to a power source for electrification by a bonding method which enables high conductivity. In particular, brazing is often selected as a bonding method which enables heat resistance, does not involve melting a bonding object, and has a relatively small influence on a surface feature. In particular, when the bonding object is formed of Cu, a copper phosphorus brazing filler metal specified in JIS Z 3264-1985 is often used. The copper phosphorus brazing filler metal is classified into BCuP-1 to BCuP-6, and with regard to a solidus line (a temperature at which a material in a solid form at low temperature starts to be transformed into a liquid state when increased in temperature) and a liquidus line (a temperature at which a material in a liquid state at high temperature starts to be transformed into a solid state when reduced in temperature, as a converse phenomenon to the case of the solidus line), has a solidus line of from about 645° C. to about 710° C. and a liquidus line of about 720° C. to about 925° C. Copper has a melting point of about 1,085° C., and hence brazing can be performed without melting copper serving as the bonding object. However, depending on brazing conditions, the copper phosphorus brazing filler metal exhibits a significantly low conductivity of 15% IACS or less because phosphorus has a low conductivity while copper has a high conductivity. In addition, in order that the brazing filler metal has such versatility that the brazing filler metal can be used even in the case of using aluminum (melting point: about 660° C.) as the bonding object in addition to copper, it is desired that the brazing filler metal have a liquidus line of 500° C. or less.

As described above, there is a demand for a brazing filler metal having a low melting point, a high conductivity to some extent, and low cost, with an excellent balance. In view of the foregoing, a Zn-based brazing filler metal has attracted attention. Zn itself has a melting point of 420° C., but forms a eutectic alloy when about 5 wt % of Al is added thereto, and its melting point is reduced to about 380° C. Thus, the Zn-based brazing filler metal can be said to be a brazing filler metal significantly excellent in operation property.

With regard to a bonded structure in which a Cu-based bonding object is bonded with a Zn-based brazing filler metal, and a bonding method therefor, the following contents have already been disclosed.

In Patent Document 1, with regard to a winding wire of an electric motor (motor) for a compressor, there is disclosed a bonded structure in which an aluminum winding wire is wound around a copper winding wire, and a wound site is brazed with a brazing filler metal containing zinc and aluminum as main components.

In addition, in Patent Document 2, there are disclosed a bonding method including the steps of: sandwiching ZnAl eutectic solder between a Cu substrate and a semiconductor device; increasing the temperature of the ZnAl eutectic solder while applying a load thereto to fuse the ZnAl eutectic solder, to thereby form a ZnAl solder layer; and reducing the temperature of the ZnAl solder layer while applying a load thereto, to thereby perform bonding, and a bonded structure obtained thereby.

In addition, in Patent Document 3, there are disclosed a bonded structure in which, while a bonding object is formed only of Al, diffusion bonding is performed at 420° C. by using a Zn—Al alloy as a material alloy of an insert material, and a bonding process therefor.

Next, in Patent Document 4, there is disclosed that, with regard to an intermetallic compound formed at a bonded interface between Zn and Cu, a TiN layer is formed as a barrier layer on SiC serving as a semiconductor member, a Zn layer and a Cu layer are sequentially formed under the TiN layer, and the Zn layer and the Cu layer react with each other to form a $CuZn_5$ layer and a $Cu_5Zn_8$ layer at an interface between the Zn layer and the Cu layer.

CITATION LIST

Patent Document

Patent Document 1: WO 2015/170572 A1
Patent Document 2: Japanese Patent Application Laid-open No. 2013-030607
Patent Document 3: Japanese Patent Application Laid-open No. 2013-078795
Patent Document 4: WO 2011/108436 A1

SUMMARY OF THE INVENTION

Technical Problem

As described above, the bonded structure using the Cu-based bonding object and the Zn-based brazing filler metal is used as, for example, a joint between a Cu-based winding wire and an electrode terminal, a lead wire, or the like constituting various electric motors. However, such joint has a problem in that contact resistance is sometimes increased at a bonded interface through energization operation at high temperature at from about 200° C. to about 250° C. to cause a conduction failure. However, a mechanism and a countermeasure therefor have not been known.

In Patent Document 1, there is disclosed that Cu is brazed with the brazing filler metal containing Zn as a main component, but the structure of a bonded interface between Cu and Zn is not disclosed in detail. Also in Patent Document 2, the structure of a bonded interface between Cu and Zn is not disclosed in detail as in Patent Document 1. In Patent Document 3, the composition and melting point of the Zn alloy material containing Zn as a main component, and a typical bonding temperature are disclosed, but the bonding object is formed only of Al, and there is no disclosure of an interface reaction with Cu. In Patent Document 4, there is disclosed that two different kinds of intermetallic compounds are formed at the interface between the Cu layer and the Zn layer, but there is no disclosure of a relationship between these intermetallic compounds and contact resistance.

An object of the present invention is to provide a bonded structure and a bonding method which each use a Cu-based bonding object and a Zn-based brazing filler metal, and which are each excellent in bonding reliability.

Solution to the Problem

According to one embodiment of the present invention, there is provided a bonded structure, including a Cu-based bonding object bonded with a Zn-based brazing filler metal, wherein the bonded structure includes a joint including a first alloy phase, a second alloy phase, and a third alloy phase between the Zn-based brazing filler metal and the Cu-based bonding object, wherein the first alloy phase is an alloy phase having a basic composition of $Cu_5Zn_8$ and being formed on a Cu-based bonding object side of the joint, wherein the third alloy phase is an alloy phase having a basic composition of $CuZn_4$ or $CuZn_5$ and being formed on a Zn-based brazing filler metal side of the joint, and in which part of a surface thereof on the Cu-based bonding object side is in contact with the first alloy phase, wherein the second alloy phase is an alloy phase having a basic composition of $CuZn_3$ and being formed at an interface between the first alloy phase and the third alloy phase, and wherein, in a cross section parallel to a bonding direction, a ratio of the second alloy phase at the interface between the first alloy phase and the third alloy phase being less than 80%.

According to another embodiment of the present invention, there is provided a bonding method, including brazing a bonding object including a Cu-based bonding object by heating to melt a Zn-based brazing filler metal, the method including, at the time of brazing, controlling a maximum achieving temperature at a bonded interface between the Cu-based bonding object and the Zn-based brazing filler metal to less than 560° C.

Advantageous Effects of the Invention

The formation of voids can be suppressed at the bonded interface between the Cu-based bonding object and the Zn-based brazing filler metal, and as a result, a bonded structure having high bonding reliability can be obtained.

DESCRIPTION OF THE EMBODIMENTS

The inventors of the present invention have made investigations on the cause of a phenomenon in which contact resistance is increased in a bonded structure using a Cu-based bonding object and a Zn-based brazing filler metal through an energization operation at high temperature. As a result, as described below, it has been found that a $CuZn_3$ alloy phase is formed at a bonded interface between the Cu-based bonding object and the Zn-based brazing filler metal at the time of brazing, and further, a thermal shock is repetitively applied to a joint, which results in the increase in contact resistance. In addition, it has been found that the increase in contact resistance can be suppressed and bonding reliability can be improved by suppressing the formation of the $CuZn_3$ alloy phase.

The present invention is described in detail below.

First Embodiment

Figure 1:
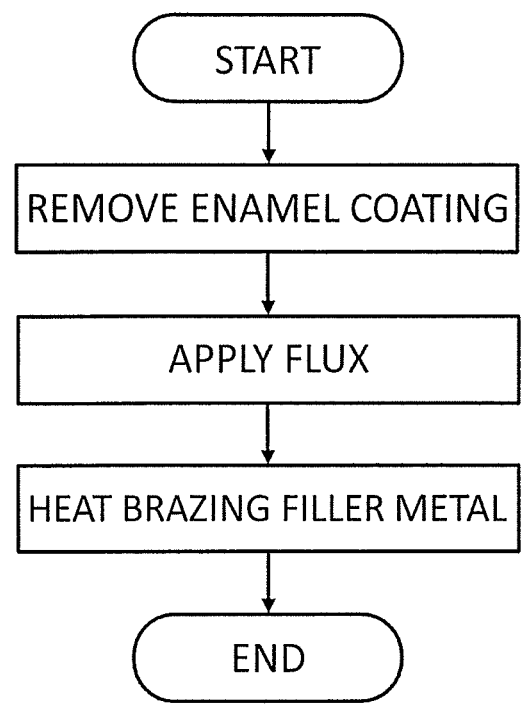
FIG. 1 is a flowchart of a bonding process for a bonded structure according to a first embodiment of the present invention.
Figure 2:
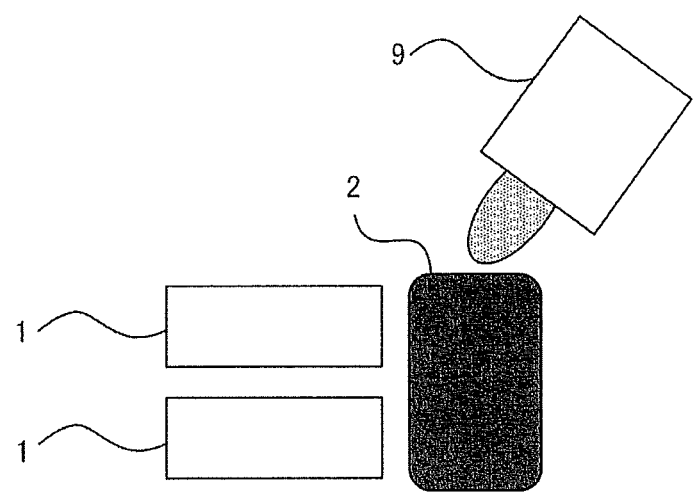
FIG. 2 is a schematic view of the bonded structure according to the first embodiment of the present invention before bonding.
Figure 3:
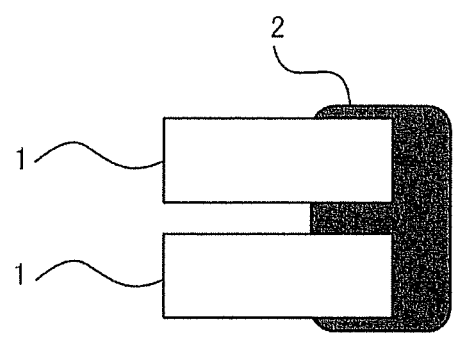
FIG. 3 is a schematic view of the bonded structure according to the first embodiment of the present invention after the bonding.

A first embodiment of the present invention is described with reference to FIG. 1 to FIG. 10 and Table 1. A flowchart of a bonding process according to the first embodiment is illustrated in FIG. 1. In order to simulate a Cu winding wire to be used in various electric motors, a pair of Cu wires 1 (purity: 99.9%) on each of which a surface thereof was coated with enamel, and which each have a size of φ1 mm were prepared as bonding objects. First, the enamel coatings of the Cu wires 1 were removed only in a joint. Next, a Cs—Al—F compound (type: CF-5, manufactured by Daiichi Kigenso Kagaku Kogyo Co., Ltd.) in the form of a milk white slurry serving as a flux (a material for reducing an oxide film on a surface to be bonded) was applied on the surfaces of the Cu wires 1 from which the enamel coatings had been removed. In order to monitor a temperature at a bonded interface during brazing, the pair of Cu wires 1 were twisted with each other to be temporarily fixed, and a commercially available K-type thermocouple was inserted into a gap between the twisted Cu wires. Next, a Zn-based brazing filler metal 2 was prepared. The Zn-based brazing filler metal refers to a brazing filler metal containing Zn as a main component. As the Zn-based brazing filler metal 2, a Zn wire or a Zn—Al wire (manufactured by Senju Metal Industry Co., Ltd. or Nihon Superior Co., Ltd.) in which Al was added at from 0.1 wt % (% by weight: wt %) to 15 wt %, and which has a size of $\varphi_1$ mm was used. Next, as illustrated in FIG. 2, the Cu wires 1 and the Zn-based brazing filler metal 2 were bonded to each other by being heated with a burner heating device 9. Thus, a bonded sample as illustrated in FIG. 3 was produced (Examples 1 to 7 and Comparative Examples 1 to 11). A model SW-125 manufactured by Sun Well Co., Ltd. was used as the burner heating device 9, and a burner nozzle diameter was set to an inner diameter of 0.72 mm (No. 19 nozzle). An output (pressure) was appropriately adjusted within a range of from 0.08 kg/cm$^2$ to 1.0 kg/cm$^2$. Hydrogen and oxygen gases were produced in purified forms from water and electricity, and the burner was heated by ignition, and the form of flame was appropriately adjusted. As a heating time period of the burner, it took from about 2 seconds to about 5 seconds to melt the Zn-based brazing filler metal 2 to cause the Zn-based brazing filler metal 2 to fit with the bonding objects. The temperature at the bonded interface during brazing was monitored with the K-type thermocouple, and was adjusted so that a predetermined maximum achieving temperature was obtained. When the temperature is increased to around the target maximum achieving temperature, the temperature can be finely adjusted by keeping the burner away from the joint. The maximum achieving temperature can be adjusted in the above-mentioned manner by temporarily fixing the position of the burner with a fixture to some extent, and finely adjusting the position by hand.

surface obtained by melting the brazing filler metal cannot be observed by an optical microscope. Thus, the state of shrinkage cavity generation can be confirmed. In this embodiment, the evaluation was performed based on visual observation with a mounting failure inspection system RV-550 manufactured by Technitron Supply Corporation. Cases in which wrinkles or shrinkage cavities were clearly observed in the evaluation based on visual observation are represented by Symbol "x", and cases in which wrinkles or shrinkage cavities were not clearly observed in the evaluation based on visual observation are represented by Symbol "○".

The evaluation results of the initial bonding properties are shown in Table 1. In each of the cases of the Zn-based brazing filler metals to which Al was added at from 0.1 wt % to 14 wt %, the rating of the initial bonding properties was "○". The combination of Zn and Al exhibits a eutectic point (380° C.), and hence it is considered that, when a small amount of Al is added to Zn, the initial bonding properties are improved. Meanwhile, in each of the cases of the Zn-based brazing filler metals to which Al was not added and the Zn-based brazing filler metals to which Al was added at 15 wt %, wrinkles or shrinkage cavities were observed on the surface of the joint, and the rating of the initial bonding

TABLE 1

| | Brazing filler metal | Maximum achieving temperature during brazing [° C.] | Initial bonding properties | Bonding reliability | Ratio of second alloy phase [%] |
|---|---|---|---|---|---|
| Example 1 | Zn—5Al | 513 | ○ | ○ | 10% |
| Example 2 | Zn—5Al | 530 | ○ | ○ | 34% |
| Example 3 | Zn—5Al | 556 | ○ | ○ | 38% |
| Comparative Example 1 | Zn—5Al | 560 | ○ | x | 88% |
| Comparative Example 2 | Zn—5Al | 583 | ○ | x | 92% |
| Comparative Example 3 | Zn—5Al | 598 | ○ | x | 98% |
| Comparative Example 4 | Zn | 556 | xWrinkle | x | 79% |
| Comparative Example 5 | Zn | 563 | xWrinkle | x | 97% |
| Example 4 | Zn—0.1Al | 558 | ○ | ○ | 61% |
| Comparative Example 6 | Zn—0.1Al | 561 | ○ | x | 96% |
| Example 5 | Zn—3Al | 558 | ○ | ○ | 41% |
| Comparative Example 7 | Zn—3Al | 562 | ○ | x | 93% |
| Example 6 | Zn—8Al | 557 | ○ | ○ | 32% |
| Comparative Example 8 | Zn—8Al | 564 | ○ | x | 85% |
| Example 7 | Zn—14Al | 554 | ○ | ○ | 30% |
| Comparative Example 9 | Zn—14Al | 561 | ○ | x | 82% |
| Comparative Example 10 | Zn—15Al | 559 | xShrinkage cavity | x | 29% |
| Comparative Example 11 | Zn—15Al | 562 | xShrinkage cavity | x | 81% |

After the production of the bonded sample, initial bonding properties were evaluated. As the initial bonding properties, the state of shrinkage cavity and wrinkle generation was visually observed on a surface of the joint. A case in which the surface has a large number of wrinkles or irregularities means that the brazing filler metal did not fit sufficiently. It is significantly difficult to quantitatively represent the state of shrinkage cavity generation, but when shrinkage cavities are generated, irregularities like wrinkles are formed on a surface of the Zn-based brazing filler metal 2, and a smooth properties was "x". It is considered that, when Al is not added, the bonding properties deteriorate owing to the absence of a eutectic composition having a low melting point, and wrinkles are generated on the surface of the brazing filler metal. Meanwhile, it is considered that, when Al is added at 15 wt % or more, a difference between a solidus line and a liquidus line (solid-liquid coexistence region) of the brazing filler metal is increased, and shrinkage cavities are liable to be generated. Accordingly, in order to improve the initial bonding properties, it is preferred that the addition amount of Al to the Zn-based brazing filler metal be more than 0 wt % and less than 15 wt %.

Next, each of the bonded samples was subjected to a bonding reliability evaluation test. For example, a joint of a winding wire (a winding wire including an H class insulation film) of an electric motor is instantaneously increased in temperature up to about 250° C. when the electric motor is suddenly stopped. This test is intended to simulate a state in which the instantaneous increase in temperature repetitively occurs. In the test, a thermal shock test having a high temperature of 250° C. and a low temperature of 50° C. was repetitively performed in a total of 2,000 cycles. Specifically, the following operation was repetitively performed: a predetermined voltage was applied between both sides of the bonded sample, a current 7 was caused to flow through the joint, energization was stopped when the temperature of the joint reached 250° C., followed by waiting until the temperature of the joint became 50° C. The temperature of the joint was measured with a thermoviewer as a surface temperature, and the energization conditions were adjusted so that all the samples had the same temperature conditions. After the 2,000 cycles, contact resistance was measured, and an amount of change from contact resistance at the time of initial bonding was determined. A case in which the amount of change in contact resistance was 10 mΩ or more was represented by Symbol "x", and a case in which the amount of change in contact resistance was less than 10 mΩ was represented by Symbol "○". The criteria are based on the following reason. When the amount of change in contact resistance is 10 mΩ or more, there occurs such a negative spiral that Joule heat is excessively generated owing to an increase in resistance, the joint deteriorates owing to the heat generation, and the resistance is further increased. As a result, the joint significantly deteriorates.

The evaluation results of the bonding reliability are shown in Table 1. Out of the bonded samples in each of which the rating of the initial bonding properties was "○", samples (Examples 1 to 7) each having a maximum achieving temperature during brazing of less than 560° C. achieved the rating of the bonding reliability of "0". However, samples (Comparative Examples 1 to 3 and 6 to 9) each having a maximum achieving temperature during brazing of 560° C. or more achieved the rating of the bonding reliability of "x". The bonded samples (Comparative Examples 4, 5, 10, and 11) in each of which the rating of the initial bonding properties was "x" achieved the rating of the bonding reliability of "x". This is presumably because cracks are generated from wrinkles or shrinkage cavities as an origin.

In a conventional mass production process for an electric motor, it is often the case that temperature measurement is not performed at the time of heating with a burner, and brazing is performed mostly with an operator's sense. However, when the bonding reliability is evaluated by monitoring the maximum achieving temperature during brazing as described above, it has been found that a large difference is caused in the bonding reliability based on whether or not the maximum achieving temperature reaches 560° C.

In order to clarify the details, the joint of each of the samples after the bonding reliability evaluation test was analyzed. Schematic views of cross sections each obtained by cutting the joint in a plane parallel to a bonding direction are illustrated in FIG. 4 to FIG. 7. The "bonding direction" as used herein refers to a direction from the Cu-based bonding object 1 toward the Zn-based brazing filler metal 2.

Figure 4:
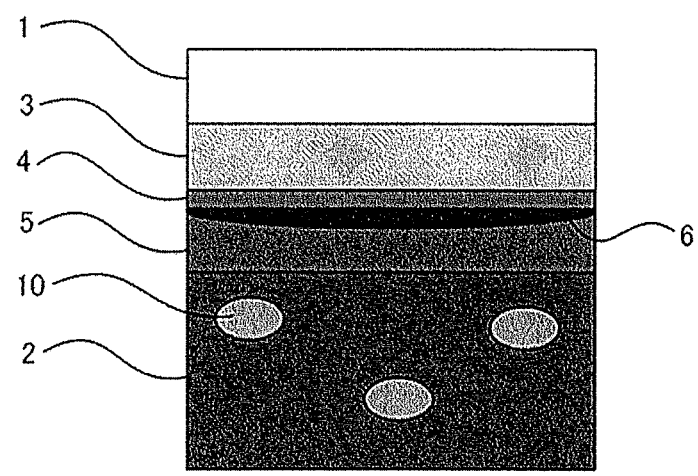
FIG. 4 is a schematic view for illustrating a vicinity of a bonded interface of a bonded structure of the Comparative Examples described in the first embodiment of the present invention.
Figure 6:
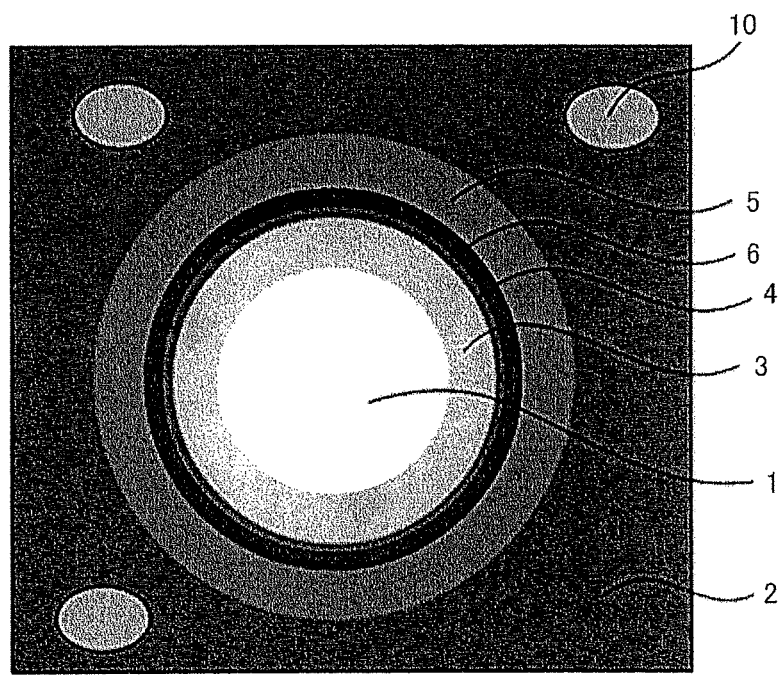
FIG. 6 is a schematic view for illustrating the bonded structure of the Comparative Examples described in the first embodiment of the present invention.

As a result, in the sample having been bonded at a maximum achieving temperature of 560° C. or more, it was found that a first alloy phase 3, a second alloy phase 4, and a third alloy phase 5 were formed from a Cu wire 1 side, and further, voids 6 were formed in the vicinity of the second alloy phase 4, as illustrated in FIG. 4 and FIG. 6. As a result of component analysis, it was found that the alloy phases had the following basic compositions: the first alloy phase 3 had a basic composition of $Cu_5Zn_8$, which was a Cu-rich Cu—Zn alloy phase; the second alloy phase 4 had a basic composition of $CuZn_3$; and the third alloy phase 5 had a basic composition of $CuZn_4$ or $CuZn_5$, which was a Zn-rich Cu—Zn alloy phase. The alloy phases may each be a phase in which part of Zn is substituted with Al ($Cu_x(Zn, Al)_y$) in the above-mentioned basic composition. The second alloy phase 4 and the voids 6 were formed along almost the entire interface between the first alloy phase 3 and the third alloy phase 5. It is presumed that the voids 6 are formed along with the formation of the second alloy phase 4 because the voids 6 are formed in the vicinity of the second alloy phase 4.

Figure 5:
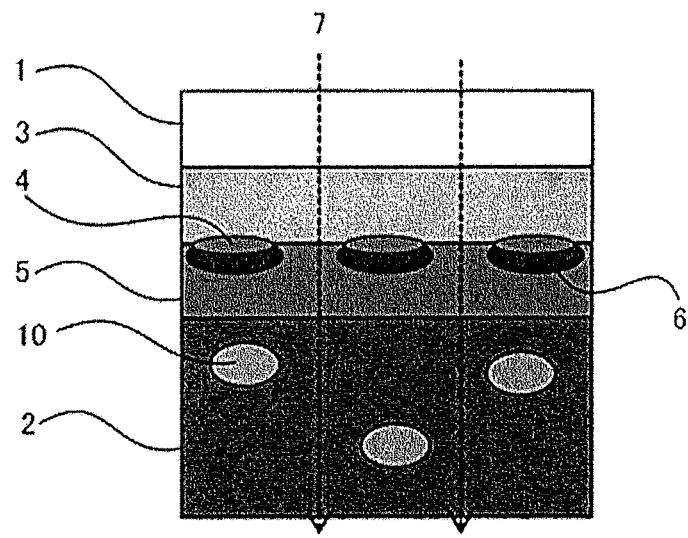
FIG. 5 is a schematic view for illustrating a vicinity of a bonded interface of a bonded structure of the Examples described in the first embodiment of the present invention.
Figure 7:
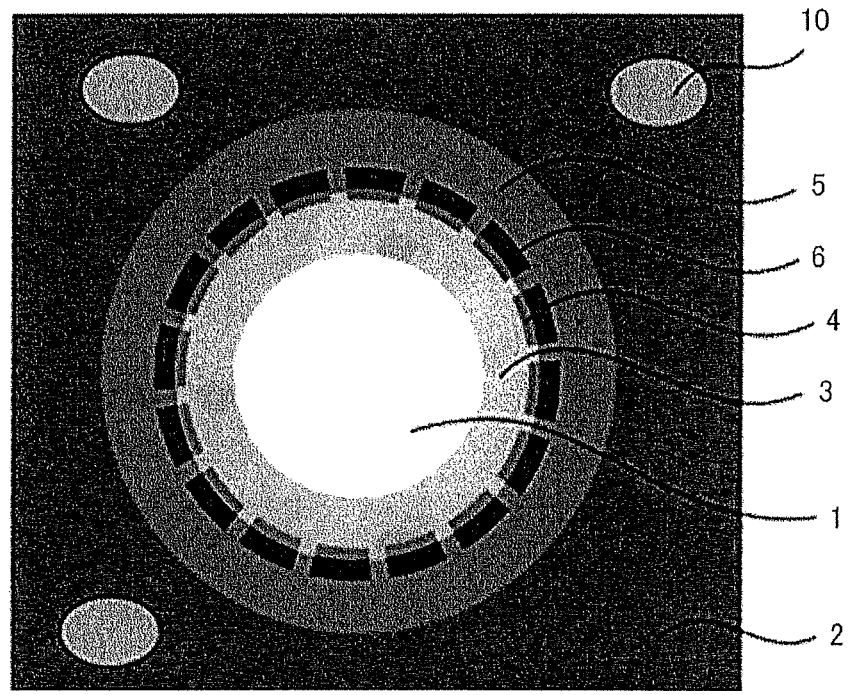
FIG. 7 is a schematic view for illustrating the bonded structure of the Examples described in the first embodiment of the present invention.

Meanwhile, in the sample having been bonded at a maximum achieving temperature of less than 560° C., a first alloy phase 3 and a third alloy phase 5 were formed in this order from a Cu wire 1 side as illustrated in FIG. 5 and FIG. 7. While a second alloy phase 4 and voids 6 were partially formed between the first alloy phase 3 and the third alloy phase 5, the second alloy phase 4 and the voids 6 formed a discontinuous phase. It was found that the first alloy phase 3 and the third alloy phase 5 were in sufficient contact with each other in a region in which the second alloy phase 4 and the voids 6 were not present, and a current 7 flowed therethrough.

Figure 8:
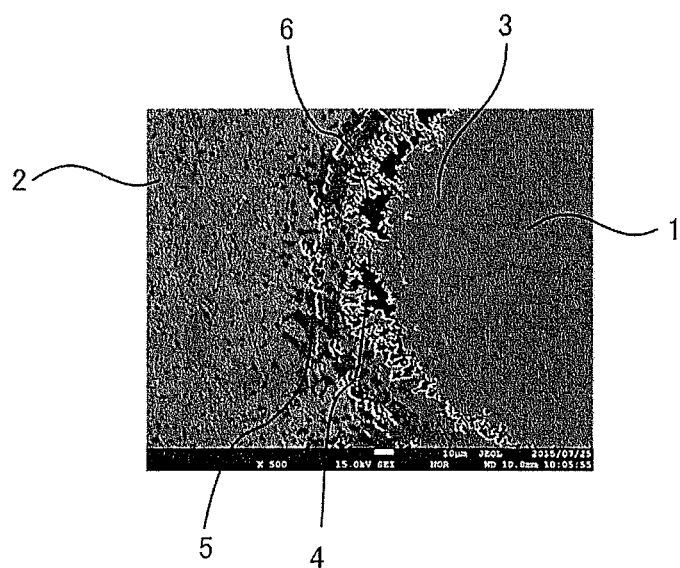
FIG. 8 is a sectional image of the bonded structure of the Comparative Examples after a bonding reliability test described in the first embodiment of the present invention.
Figure 9:
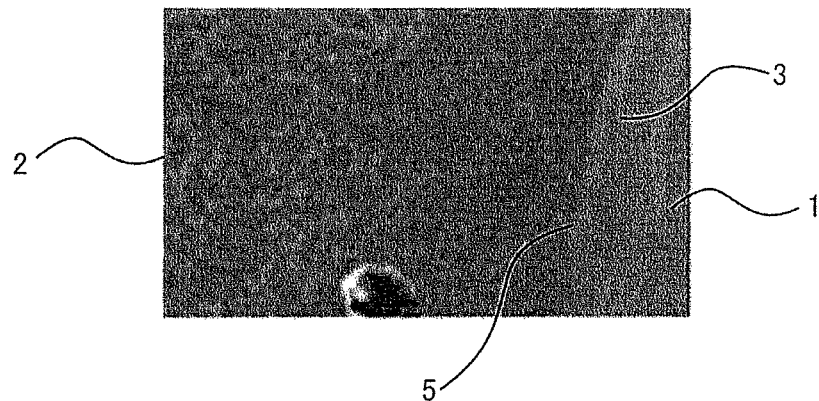
FIG. 9 is a sectional image of the bonded structure of the Examples after a bonding reliability test described in the first embodiment of the present invention.

A sectional observation image of the sample having been bonded at a maximum achieving temperature of 560° C. or more is shown in FIG. 8, and a sectional observation image of the sample having been bonded at a maximum achieving temperature of less than 560° C. is shown in FIG. 9. From FIG. 8, it is found that, in the sample having been bonded at a temperature of 560° C. or more, in addition to the first alloy phase 3 and the third alloy phase 5, the second alloy phase 4 ($CuZn_3$) and the voids 6 were formed along almost the entire interface between the first alloy phase 3 and the third alloy phase 5. Meanwhile, from FIG. 9, it is found that, in the sample having been bonded at a temperature of less than 560° C., the second alloy phase 4 and the voids 6 are not formed at an interface between the first alloy phase 3 and the third alloy phase 5.

The reason why the voids 6 are formed in the vicinity of the second alloy phase 4 is presumed to be as described below. $CuZn_3$ constituting the second alloy phase 4 has a higher density than the first alloy phase 3 ($Cu_5Zn_8$) and the third alloy phase 5 ($CuZn_4$, $CuZn_5$) and hence contraction in volume occurs in association with the formation of the second alloy phase 4 by phase transformation from the first alloy phase 3 and the third alloy phase 5, with the result that the voids 6 are formed. When the maximum achieving temperature during bonding is 560° C. or more, the second alloy phase 4 is formed along almost the entire interface between the first alloy phase and the third alloy phase, and hence the voids 6 are also formed along almost the entire interface, which results in a conduction failure. Meanwhile, when the maximum achieving temperature is less than 560° C., the formation of the second alloy phase is suppressed to form the discontinuous phase, and hence the voids 6 are also discontinuous. Thus, a conduction failure does not occur.

In addition, the reason why the contact resistance is low immediately after bonding and is increased after a thermal shock is repetitively applied thereto, though the voids 6 are formed during the bonding process, is presumed to be as described below. It is presumed that, though the voids 6 are formed during the bonding process, the Zn-based brazing filler metal in a molten state penetrates into the voids 6 during the bonding process, and hence the voids 6 are in the state of being filled with the Zn-based brazing filler metal after the bonding, and thus the voids 6 cannot be observed and also the contact resistance is low. Moreover, it is presumed that, when a thermal shock at about 250° C. (a temperature lower than the melting points of the Zn-based brazing filler metal and the alloy phase) is repetitively applied, solid phase diffusion occurs between the Zn-based brazing filler metal filled in the voids 6 and its surrounding alloy phase, a deviation in atom transfer occurs at this time owing to mismatch in diffusion coefficient, and hence the Zn-based brazing filler metal filled in the voids 6 diffuses to cause the voids 6 to appear again, which results in an increase in contact resistance.

This phenomenon is not found only through the evaluation of the initial bonding properties, and also in the evaluation of the bonding reliability, is not clarified merely by a high temperature retention test, but is clarified by the above-mentioned testing method in which the instantaneous excessive increase in temperature in the state in which the electric motor is suddenly stopped is replicated. This phenomenon only occurs when the second alloy phase 4 and voids 6 are formed during brazing, and further, a severe thermal shock is repetitively applied thereto. The present invention is of great technical significance in that the above-mentioned mechanism is clarified and a countermeasure against the phenomenon is found.

From the foregoing, it has been found that, when the maximum achieving temperature during brazing is 560° C. or more, the second alloy phase 4 ($CuZn_3$) and the voids 6 are formed along almost the entire interface between the first alloy phase 3 and the third alloy phase 5, which results in an increase in contact resistance. It has also been found that, when the maximum achieving temperature during brazing is controlled to less than 560° C. to suppress the formation of the second alloy phase 4 and thus the formation of the voids 6, a bonded structure which has a small change in contact resistance even through energization operation at high temperature, and which has high bonding reliability can be obtained.

Particularly when a Cu winding wire and another bonding object (another winding wire, a lead wire, a terminal, or the like) are bonded to each other with the Zn-based brazing filler metal in an electric motor, the Zn-based brazing filler metal has almost always been heated with a burner or the like without controlling the temperature at the bonded interface. However, when the maximum achieving temperature at the bonded interface during brazing is controlled to less than 560° C. as described above, an electric motor which has a small change in contact resistance of a joint even through energization operation at high temperature, and which has high bonding reliability can be obtained.

In addition, the inventors of the present invention have made investigations as to how much the amount of the second alloy phase 4 in the bonded interface affects the bonding reliability. For each of the bonding samples after the bonding reliability test, the cross section parallel to the bonding direction was observed, and a ratio of the second alloy phase 4 at the interface between the first alloy phase 3 and the third alloy phase 5 (in a sectional view, a length with which the second alloy phase 4 was formed/a length of the interface between the first alloy phase 3 and the third alloy phase (whole circumference)) was analyzed by elemental analysis with a scanning electron microscope (SEM). The analysis results are shown in Table 1. In each of the samples having been formed at a maximum achieving temperature at the bonded interface of less than 560° C., the ratio of the second alloy phase 4 was less than 80%. Meanwhile, in each of the samples having been formed at 560° C. or more, the ratio of the second alloy phase 4 was 80% or more. From those facts, it has been found that, when the ratio of the second alloy phase 4 at the interface between the first alloy phase 3 and the third alloy phase 5 is less than 80% in a cross section parallel to the bonding direction, sufficient bonding reliability is obtained. In Comparative Examples 4 and 10, though the maximum achieving temperature at the bonded interface was less than 560° C., and the ratio of the second alloy phase 4 was less than 80%, the result was that the bonding reliability was low. This is presumably because of a cause other than the second alloy phase, that is, the generation of cracks from wrinkles or shrinkage cavities as an origin at the time of initial bonding.

Figure 10:
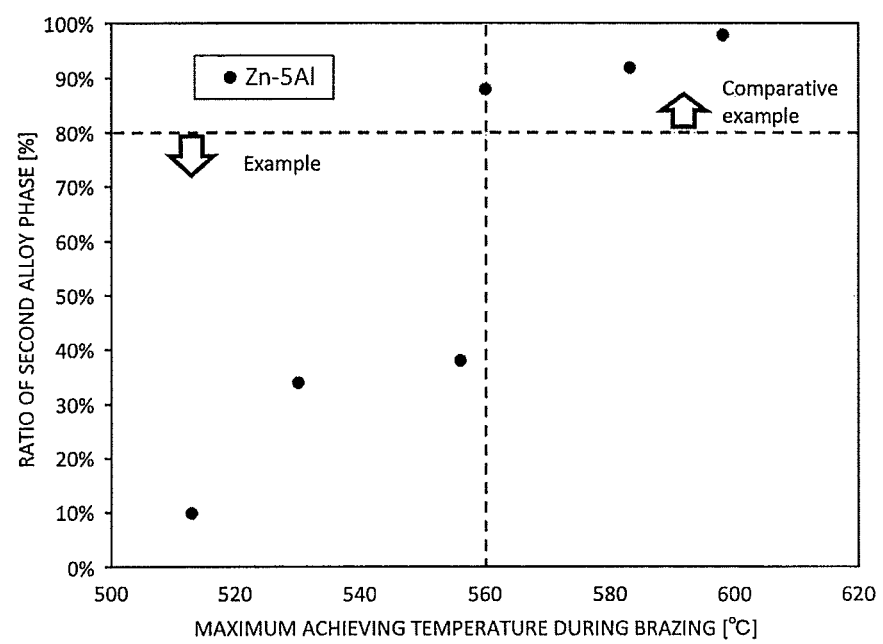
FIG. 10 is a graph of Table 1 shown in the first embodiment of the present invention.

In addition, in Table 1, for Examples 1 to 3 and Comparative Examples 1 to 3 each using the Zn-5Al brazing filler metal, a graph representing the maximum achieving temperature during brazing on the abscissa and the ratio of the second alloy phase on the ordinate is shown in FIG. 10. It is found that, when the maximum achieving temperature during brazing is less than 560° C., the ratio of the second alloy phase is less than 80%, but when the maximum achieving temperature during brazing is 560° C. or more, the ratio of the second alloy phase is 80% or more.

As described above, the bonded structure according to the first embodiment includes a joint including the first alloy phase 3, the second alloy phase 4, and the third alloy phase 5 between the Zn-based brazing filler metal 2 and the Cu-based bonding object 1, the first alloy phase 3 is an alloy phase having a basic composition of $Cu_5Zn_8$ and being formed on a Cu-based bonding object side of the joint, the third alloy phase 5 is an alloy phase having a basic composition of $CuZn_4$ or $CuZn_5$ and being formed on a Zn-based brazing filler metal side of the joint, and in which part of a surface thereof on the Cu-based bonding object side is in contact with the first alloy phase, the second alloy phase 4 is an alloy phase having a basic composition of $CuZn_3$ and being formed at an interface between the first alloy phase 3 and the third alloy phase 5, and, in a cross section parallel to a bonding direction, a ratio of the second alloy phase 4 at the interface between the first alloy phase 3 and the third alloy phase 5 is less than 80%.

In addition, the method of manufacturing a bonded structure according to the first embodiment includes, at the time of brazing a bonding object including the Cu-based bonding object 1 by heating to melt the Zn-based brazing filler metal 2, controlling a maximum achieving temperature at a bonded interface between the Cu-based bonding object 1 and the Zn-based brazing filler metal 2 to less than 560° C.

According to the bonded structure and the method of manufacturing a bonded structure according to the first embodiment, the formation of voids can be suppressed at the bonded interface between the Cu-based bonding object 1 and the Zn-based brazing filler metal 2, and as a result, a bonded structure having high bonding reliability can be obtained.

In addition, when the Zn-based brazing filler metal 2 containing more than 0 wt % and less than 15 wt % of Al is used in the bonded structure and the method of manufacturing a bonded structure of the first embodiment, a bonded structure excellent in initial bonding properties can be obtained.

Second Embodiment

Figure 11:
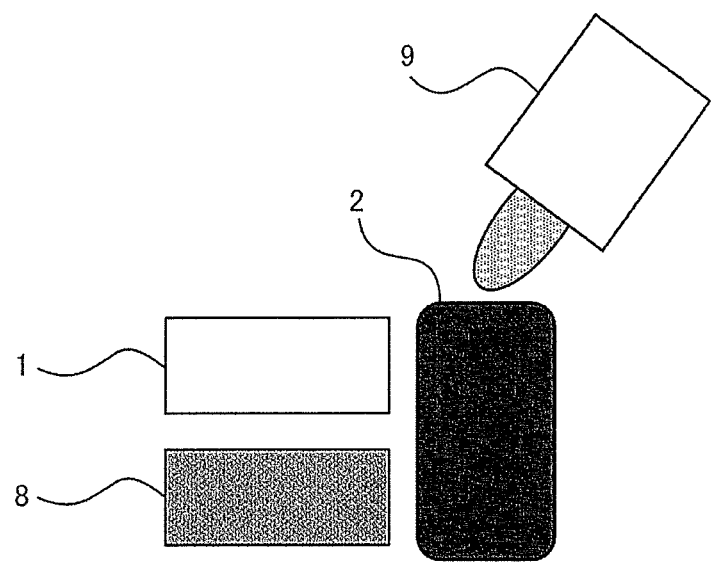
FIG. 11 is a schematic view of a bonded structure according to a second embodiment of the present invention before bonding.
Figure 12:
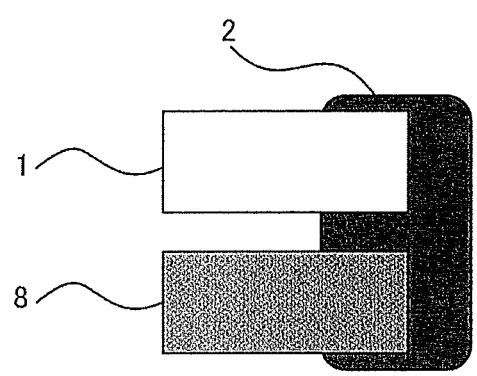
FIG. 12 is a schematic view of the bonded structure according to the second embodiment of the present invention after the bonding.

While the pair of Cu wires 1 were used as the bonding objects in the first embodiment, a Cu wire 1 and an Al wire 8 were used as bonding objects in a second embodiment. As the Al wire 8, an Al wire having a wire diameter of φ1 mm was used. As illustrated in FIG. 11 and FIG. 12, bonded samples were each produced by the same bonding process as in the first embodiment except that the bonding object was changed, and were each subjected to evaluation of initial bonding properties and bonding reliability. With regard to a temperature during brazing, the samples were selected so that substantially the same temperature as in the first embodiment was obtained, albeit slightly different from the first embodiment.

TABLE 2

| | Brazing filler metal | Maximum achieving temperature during brazing [° C.] | Initial bonding properties | Bonding reliability | Ratio of second alloy phase [%] |
|---|---|---|---|---|---|
| Example 8 | Zn—5Al | 530 | ○ | ○ | 8% |
| Example 9 | Zn—5Al | 541 | ○ | ○ | 31% |
| Example 10 | Zn—5Al | 552 | ○ | ○ | 36% |
| Comparative Example 12 | Zn—5Al | 562 | ○ | x | 84% |
| Comparative Example 13 | Zn—5Al | 584 | ○ | x | 90% |
| Comparative Example 14 | Zn—5Al | 594 | ○ | x | 95% |
| Example 11 | Zn | 558 | ○ | ○ | 74% |
| Comparative Example 15 | Zn | 562 | ○ | x | 95% |
| Example 12 | Zn—0.1Al | 554 | ○ | ○ | 59% |
| Comparative Example 16 | Zn—0.1Al | 563 | ○ | x | 94% |
| Example 13 | Zn—3Al | 559 | ○ | ○ | 37% |
| Comparative Example 17 | Zn—3Al | 562 | ○ | x | 91% |
| Example 14 | Zn—8Al | 557 | ○ | ○ | 30% |
| Comparative Example 18 | Zn—8Al | 561 | ○ | x | 84% |
| Example 15 | Zn—14Al | 558 | ○ | ○ | 27% |
| Comparative Example 19 | Zn—14Al | 562 | ○ | x | 81% |
| Comparative Example 20 | Zn—15Al | 557 | xShrinkage cavity | x | 24% |
| Comparative Example 21 | Zn—15Al | 563 | xShrinkage cavity | x | 80% |

The evaluation results of the initial bonding properties are shown in Table 2. As in the first embodiment, in each of the cases of the Zn-based brazing filler metals to which Al was added at from 0.1 wt % to 14 wt %, the rating was "○", and in each of the cases of the Zn-based brazing filler metals to which Al was added at 15 wt %, the rating was "x". Meanwhile, in each of Example 11 and Comparative Example 15 using a Zn-based brazing filler metal free of Al, satisfactory initial bonding properties were obtained, unlike in Comparative Example 4 and Comparative Example 5 in the first embodiment. This is presumably because Al diffuses from the Al wire 8 into the brazing filler metal during brazing, and hence a Zn—Al eutectic phase (380° C.) having a low melting point is formed in a small amount, which contributes to improvement in initial bonding properties. The "free of Al" means that the concentration of Al is 0.001 wt % or less. In this embodiment, the brazing filler metal is analyzed by inductively coupled plasma (ICP) emission spectrometry in accordance with JIS Z 3282, and is regarded as being "free of Al" when the concentration of Al is 0.001 wt % or less, which is regarded as an impurity level.

Accordingly, it has been found that, even in the case of using the Zn-based brazing filler metal free of Al, when Al is used as part of the bonding objects, Al diffuses into the brazing filler metal, and thus the initial bonding properties between the Cu-based bonding object and the Zn-based brazing filler metal are improved. A method of supplying Al is not limited to the use of the Al wire. The same effect is obtained through use of, for example, an Al plate or a Cu wire plated with Al.

The evaluation results of bonding reliability are shown in Table 2. As in the first embodiment, out of the bonded samples in each of which the rating of the initial bonding properties was "○", samples each having been bonded at a maximum achieving temperature of less than 560° C. achieved the rating of the bonding reliability of "○", and samples each having been bonded at a maximum achieving temperature of 560° C. or more achieved the rating of the bonding reliability of "x". In addition, in the sample having been bonded at 560° C. or more, a cross section of a joint between the Cu wire 1 and a Zn-based brazing filler metal 2 was observed. As a result, it was found that a second alloy phase 4 and voids 6 were formed between a first alloy phase 3 and a third alloy phase 5 as in the first embodiment. In addition, in each of the samples having been formed at a maximum achieving temperature of less than 560° C., the ratio of the second alloy phase 4 was less than 80%, and in each of the samples having been formed at 560° C. or more, the ratio of the second alloy phase 4 was 80% or more.

Figure 13:
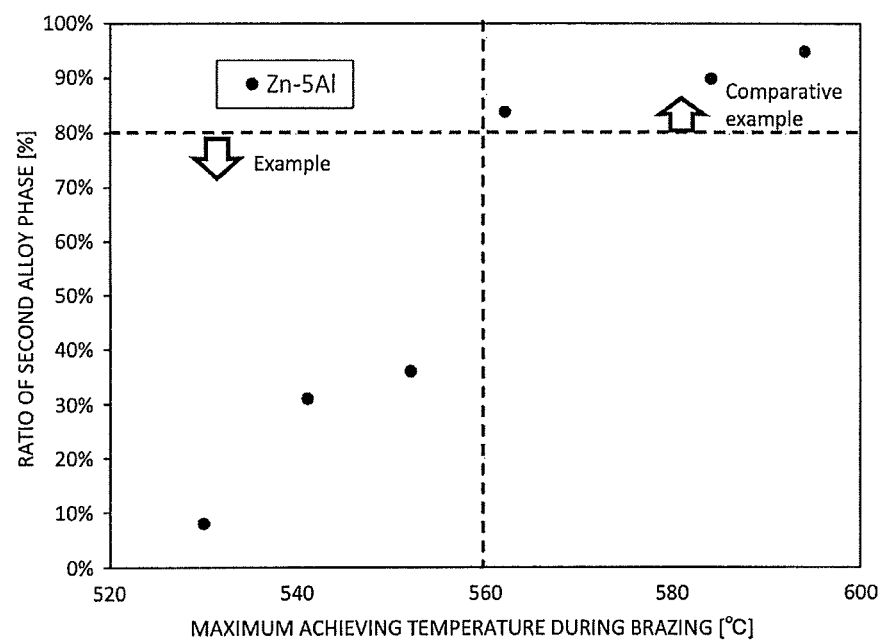
FIG. 13 is a graph of Table 2 shown in the second embodiment of the present invention.

In addition, in Table 2, for Examples 8 to 10 and Comparative Examples 12 and 13 each using the Zn-5Al brazing filler metal, a graph representing the maximum achieving temperature during brazing on the abscissa and the ratio of the second alloy phase on the ordinate is shown in FIG. 13. As in the first embodiment, it is found that, when the maximum achieving temperature during brazing is less than 560° C., the ratio of the second alloy phase is 80% or less, but when the maximum achieving temperature during brazing is 560° C. or more, the ratio of the second alloy phase is 80% or more.

From those facts, it has been found that, even in the case of using the Cu wire 1 and the Al wire 8 as the bonding objects, a joint which becomes the greatest factor for reduction in bonding reliability is an interface between the Cu wire 1 and the Zn-based brazing filler metal 2, and when the maximum achieving temperature at the interface is controlled to less than 560° C. to suppress the formation of the second alloy phase 4 as in the first embodiment, a bonded structure having high bonding reliability can be obtained.

In addition, the amount of a Cu—Al alloy phase 10 dispersed in the Zn-based brazing filler metal 2 after bonding was not increased as compared to that in the first embodiment. From the fact, it is considered that the amount of Al diffusing from the Al wire 8 into the Zn-based brazing filler metal 2 is a slight amount. Also from the fact that substantially the same results as in the first embodiment are obtained in the bonding reliability test and sectional observation, it is considered that the Al diffusion has little influence on alloy formation at the Cu—Zn bonded interface and bonding reliability.

As described above, the bonded structure according to the second embodiment includes the Zn-based brazing filler metal 2, the Cu-based bonding object 1, and the Al-based bonding object 8, wherein the bonded structure includes a joint including the first alloy phase 3, the second alloy phase 4, and the third alloy phase 5 between the Zn-based brazing filler metal 2 and the Cu-based bonding object 1, wherein the first alloy phase 3 is an alloy phase having a basic composition of $Cu_5Zn_8$ and being formed on a Cu-based bonding object side of the joint, wherein the third alloy phase 5 is an alloy phase having a basic composition of $CuZn_4$ or $CuZn_5$ and being formed on a Zn-based brazing filler metal side of the joint, and in which part of a surface thereof on the Cu-based bonding object side is in contact with the first alloy phase, wherein the second alloy phase 4 is an alloy phase having a basic composition of $CuZn_3$ and being formed at an interface between the first alloy phase 3 and the third alloy phase 5, and wherein, in a cross section parallel to a bonding direction, a ratio of the second alloy phase 4 to the interface between the first alloy phase 3 and the third alloy phase 5 is less than 80%.

In addition, the method of manufacturing a bonded structure according to the second embodiment includes, at the time of brazing bonding objects including the Cu-based bonding object 1 and the Al-based bonding object 8 by heating to melt the Zn-based brazing filler metal 2, controlling a maximum achieving temperature at a bonded interface between the Cu-based bonding object 1 and the Zn-based brazing filler metal 2 to less than 560° C.

According to the bonded structure and the method of manufacturing a bonded structure according to the second embodiment, as in the first embodiment, the formation of voids can be suppressed at the bonded interface between the Cu-based bonding object 1 and the Zn-based brazing filler metal 2, and as a result, a bonded structure having high bonding reliability can be obtained. In addition, Al is supplied from the Al-based bonding object 8 into the Zn-based brazing filler metal 2, and hence even in the case of using the Zn-based brazing filler metal 2 free of Al, a bonded structure excellent in initial bonding properties can be obtained.

In each of the first embodiment and the second embodiment, the Cu wire 1 was used as the bonding object on the assumption of a winding wire of an electric motor. However, the present invention is applicable to, for example, a winding wire of an actual electric motor, and the application of the present invention is not limited thereto. For example, the present invention is applicable to various Cu—Zn bonded structures, such as a semiconductor device and a heat exchange component each using a composite material of Cu and Zn. A winding mode in the electric motor includes, but is not particularly limited to, distributed winding, concentrated winding, and other winding modes. In addition, the present invention may be applied not only to bonding of a Cu winding wire, but also to bonding of a Cu lead wire in which a plurality of fine wires are bundled with each other. In addition, the sectional shape of the Cu winding wire is not limited to a circle shape, and a rectangular shape or a flat sheet shape may be adopted. Also the wire diameter of the Cu winding wire is not limited to φ1 mm.

In addition, the bonding object is not limited to the Cu wire, and a general Cu-based bonding object containing Cu as a main component may be used. The Cu-based bonding object may include any one or more selected from Sn, Fe, Zn, Cr, Mn, Ni, Si, C, Al, S, P, W, Mg, Be, Ti, Ag, and Au.

In addition, the Zn-based brazing filler metal may include any one or more selected from Ga, In, Sn, Mg, Ge, Mn, Sb, Cr, Bi, P, V, and Si in addition to Al. Those elements to be added are each an element having a eutectic point with Zn or having a lower melting point than Zn, and hence improvement in initial bonding properties is expected through a reduction in melting point.

Possible heating methods other than the heating method with a burner are ultrasonic welding, a method involving immersion in a molten brazing layer, flow soldering, reflow soldering, a bonding method with a furnace in a reducing atmosphere or a vacuum atmosphere, or a local heating method based on high-frequency induction heating. The gas used for the heating with a burner is not limited to the hydrogen and oxygen gases. A combustible gas and a combustion supporting gas may be appropriately selected and their flow rates may be adjusted, and a gas source may include methane, propane, methane, butane, ethylene, acetylene, propylene, oxygen, or carbon dioxide. In addition, the monitoring of the temperature of a heated portion is not performed only with a thermocouple, and may be performed through utilization of a thermoviewer, a material appropriately adjusted in a boiling point, a differential calorimeter, or the like.

Figure 14:
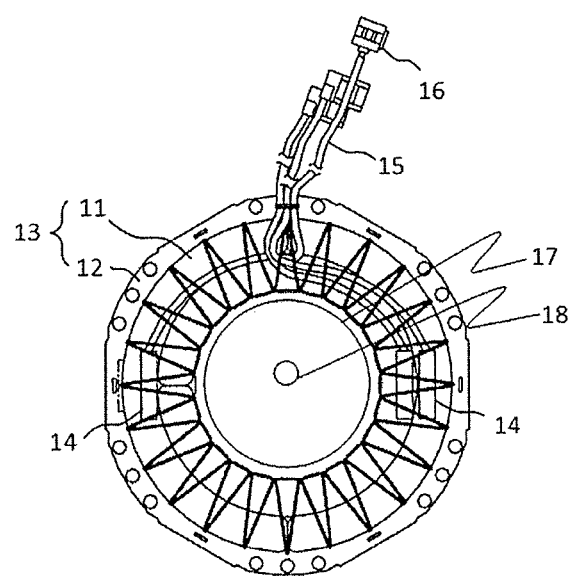
FIG. 14 is a schematic view of an electric motor to which a bonded structure of the present invention is applied.

In addition, a schematic view of an electric motor to which the bonded structure of the present invention is applied is illustrated in FIG. 14. As illustrated in FIG. 14, the electric motor is formed of a stator 13 and a rotor 17 when roughly divided. The stator 13 includes a stator core 12 and a winding wire 11 wound around the stator core 12, and the winding wire 11 is bonded to a lead wire 15. At least one of the winding wire 11 or the lead wire is formed of Cu or a Cu-based alloy, and a Zn-based brazing filler metal is used as a bonding material. The bonded structure of the present invention is used for a joint between the winding wire 11 and the lead wire 15, or a joint between the winding wires 11. When the bonded structure of the present invention is applied to the joint, an electric motor in which an increase in contact resistance and the occurrence of a conduction failure are suppressed in the joint, and which has high reliability can be obtained.

EXPLANATION ON NUMERALS

1 Cu wire
2 Zn-based brazing filler metal 3 first alloy phase
4 second alloy phase
5 third alloy phase
6 void
7 current
8 Al wire
9 heating device
10 Cu—Al alloy phase
11 winding wire
12 stator core
13 stator
14 insulating paper
15 lead wire
16 connector terminal
17 rotor
18 axis

The invention claimed is:

1. A bonded structure, comprising a Zn-based brazing filler metal and bonding objects including a Cu-based bonding object and an Al-based bonding object, the Zn-based brazing filler metal and each of the bonding objects being bonded to each other,
    wherein the bonded structure comprises a joint including a first alloy phase, a second alloy phase and a third alloy phase between the Zn-based brazing filler metal and the Cu-based bonding object,
    wherein the Zn-based brazing filler metal comprises 0.1 wt % or more and less than 15 wt % of Al, with the balance being Zn and inevitable impurities,
    wherein the first alloy phase is an alloy phase having a basic composition of $Cu_5Zn_8$ and being formed on a Cu-based bonding object side of the joint,
    wherein the third alloy phase is an alloy phase having a basic composition of $CuZn_4$ or $CuZn_5$ and being formed on a Zn-based brazing filler metal side of the joint, and in which part of a surface thereof on the Cu-based bonding object side is in contact with the first alloy phase,
    wherein the second alloy phase is an alloy phase having a basic composition of $CuZn_3$ and being formed at an interface between the first alloy phase and the third alloy phase, and
    wherein, in a cross section parallel to a bonding direction, when a total length of a length of the interface in which the first alloy phase is in contact with the third alloy phase and a length of the second alloy phase formed at the interface between the first alloy phase and the third alloy phase is defined as 100%, a ratio of the length of the second alloy phase formed at the interface between the first alloy phase and the third alloy phase is less than 80%.

2. An electric motor, comprising:
    a winding wire serving as the Cu-based bonding object; and
    the Al-based bonding object bonded to the winding wire with the Zn-based brazing filler metal,
    wherein the electric motor comprises the bonded structure of claim 1 as a joint between the winding wire and the Al-based bonding object.

3. A method of manufacturing the bonded structure of claim 1, comprising, at the time of brazing bonding objects including the Cu-based bonding object and the Al-based bonding object by heating to melt the Zn-based brazing filler metal,
    controlling a maximum achieving temperature at a bonded interface between the Cu-based bonding object and the Zn-based brazing filler metal to less than 560° C.

4. A method of manufacturing an electric motor, comprising a step of bonding a Cu-based bonding object serving as a winding wire of the electric motor and an Al-based bonding object by the method of manufacturing a bonded structure of claim 3.

\* \* \* \* \*